(12) United States Patent
Belogolov

(10) Patent No.: US 10,935,420 B2
(45) Date of Patent: Mar. 2, 2021

(54) OPTICAL INTERFACE FOR DATA TRANSMISSION

(71) Applicant: Texas Instruments Incorporated, Dallas, TX (US)

(72) Inventor: Oleg Belogolov, Nuremberg (DE)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 120 days.

(21) Appl. No.: 15/235,335

(22) Filed: Aug. 12, 2016

(65) Prior Publication Data

US 2017/0047928 A1 Feb. 16, 2017

Related U.S. Application Data

(60) Provisional application No. 62/204,705, filed on Aug. 13, 2015.

(51) Int. Cl.
*G01J 1/40* (2006.01)
*G01J 1/42* (2006.01)
*H04B 10/25* (2013.01)
*H03M 11/26* (2006.01)
*H04B 10/80* (2013.01)

(52) U.S. Cl.
CPC .............. *G01J 1/42* (2013.01); *H03M 11/26* (2013.01); *H04B 10/25* (2013.01); *H04B 10/801* (2013.01)

(58) Field of Classification Search
CPC .............................. H03M 11/02; H03M 11/26
USPC ................................................. 250/221, 551
See application file for complete search history.

(56) References Cited

U.S. PATENT DOCUMENTS

| | | | |
|---|---|---|---|
| 4,641,026 A | 2/1987 | Garcia, Jr. | |
| 6,201,521 B1 | 3/2001 | Doherty | |
| 6,741,189 B1 | 5/2004 | Gibbons, II et al. | |
| 7,088,325 B2 | 8/2006 | Ishii | |
| 7,167,619 B2 | 1/2007 | Veligdan et al. | |
| 7,373,031 B2 | 5/2008 | Wang et al. | |
| 8,208,759 B2 | 6/2012 | Carver et al. | |
| 8,368,997 B2 | 2/2013 | Endisch et al. | |
| 8,612,885 B2 | 12/2013 | Kim | |
| 8,634,009 B2 * | 1/2014 | Kelly | G02B 26/0833 348/300 |
| 8,869,625 B2 * | 10/2014 | Gutierrez | B81B 3/0037 73/777 |
| 2009/0295730 A1 | 12/2009 | Shin et al. | |

(Continued)

OTHER PUBLICATIONS

Texas Instruments Incorporated, DLP3000, DLPC300, DLP 0.3 WVGA Chipset, Data Manual, Literature No. DLPZ005A, Jan. 2012—Revised Feb. 2015, 20 pages, USA.

(Continued)

*Primary Examiner* — Kevin K Pyo
(74) *Attorney, Agent, or Firm* — Ebby Abraham; Charles A. Brill; Frank D. Cimino

(57) ABSTRACT

A data transmitter includes a keyboard with keys, a digital micromirror device (DMD) having an array of micromirrors, and a light source directed towards the array of micromirrors. The keys are connected to the DMD such that each key corresponds to a separate micromirror of the array of micromirrors in order to generate a unique light pattern associated with each depressed key. An optical transmission channel is configured to receive the unique light pattern and transfer the unique light pattern to a light sensor of a computer.

16 Claims, 3 Drawing Sheets

(56) References Cited

U.S. PATENT DOCUMENTS

| | | |
|---|---|---|
| 2011/0074983 A1 | 3/2011 | Bush |
| 2011/0149101 A1 | 6/2011 | Kim et al. |
| 2011/0151936 A1 | 6/2011 | Jang et al. |
| 2015/0122112 A1* | 5/2015 | Prichard .................. G10G 3/04 84/724 |

OTHER PUBLICATIONS

Texas Instruments Incorporated, DLPA0008A—Jul. 2008—Revised Oct. 2013, entitled "DMD 101: Introduction to Digital Micromirror Device (DMD) Technology," , 11 pages, USA.

* cited by examiner

OPTICAL INTERFACE FOR DATA TRANSMISSION

CROSS-REFERENCE TO RELATED APPLICATIONS

This application claims the benefit of priority under U.S.C. § 119(e) of U.S. Provisional Application 62/204,705, filed Aug. 13, 2015, which is hereby incorporated by reference in its entirety.

FIELD OF THE INVENTION

The invention is generally related to an optical interface for transmitting data between a transmitter and a receiver, such as between a keyboard input device and a personal computer (PC).

BACKGROUND OF THE INVENTION

It is often desirable to electronically transmit data locally from one device to another such as from a keyboard to a computer. An electronic signal interface may be used to transmit such data. A problem with electronic data transmission using an electronic signal interface is the risk that data will be exposed to electronic eavesdropping during transmission.

SUMMARY OF THE INVENTION

The disclosed interface utilizes an array of mirrors whose mirror positions are set according to an encoding scheme to generate light patterns in correspondence with data entered at the transmitter. The generated light patterns are transmitted along an optical channel to a light sensor located at the receiver. Light patterns sensed by the sensor are decoded at the receiver to recover the originally entered data.

A described embodiment utilizes a microelectromechanical system (MEMS) device in the form of a digital micromirror device (DMD) whose mirror positions are set according to an encoding scheme in correspondence with keystrokes entered at a keyboard. The DMD is illuminated with a light source to generate light patterns according to the mirror positions. The generated light patterns are optically transmitted along an optical fiber to a light sensor located at a personal computer (PC). The sensed patterns are decoded at the PC to specify the entered keystrokes. The keystroke-to-light pattern encoding scheme can be static or dynamically set.

Direct connection between the keystrokes and the mirror settings, along with transporting the keystroke information over a fiber optical path from the keyboard to the PC, eliminates the need for an electronic data stream interface vulnerable to interception by electronic eavesdropping.

An advantage of the invention is providing an optical interface which reduces the risk that data will be exposed to electronic eavesdropping during transmission between a transmitter and a receiver.

This and other advantages will be apparent to those of ordinary skill in the art having reference to the specification in conjunction with the drawings.

DETAILED DESCRIPTION OF THE EMBODIMENTS

The invention will now be described in conjunction with an optical interface between keyboard as a data transmitter and a personal computer as a data receiver. Other examples of data transmitters and data receivers will be apparent to those of ordinary skill in the art.

Figure 1:
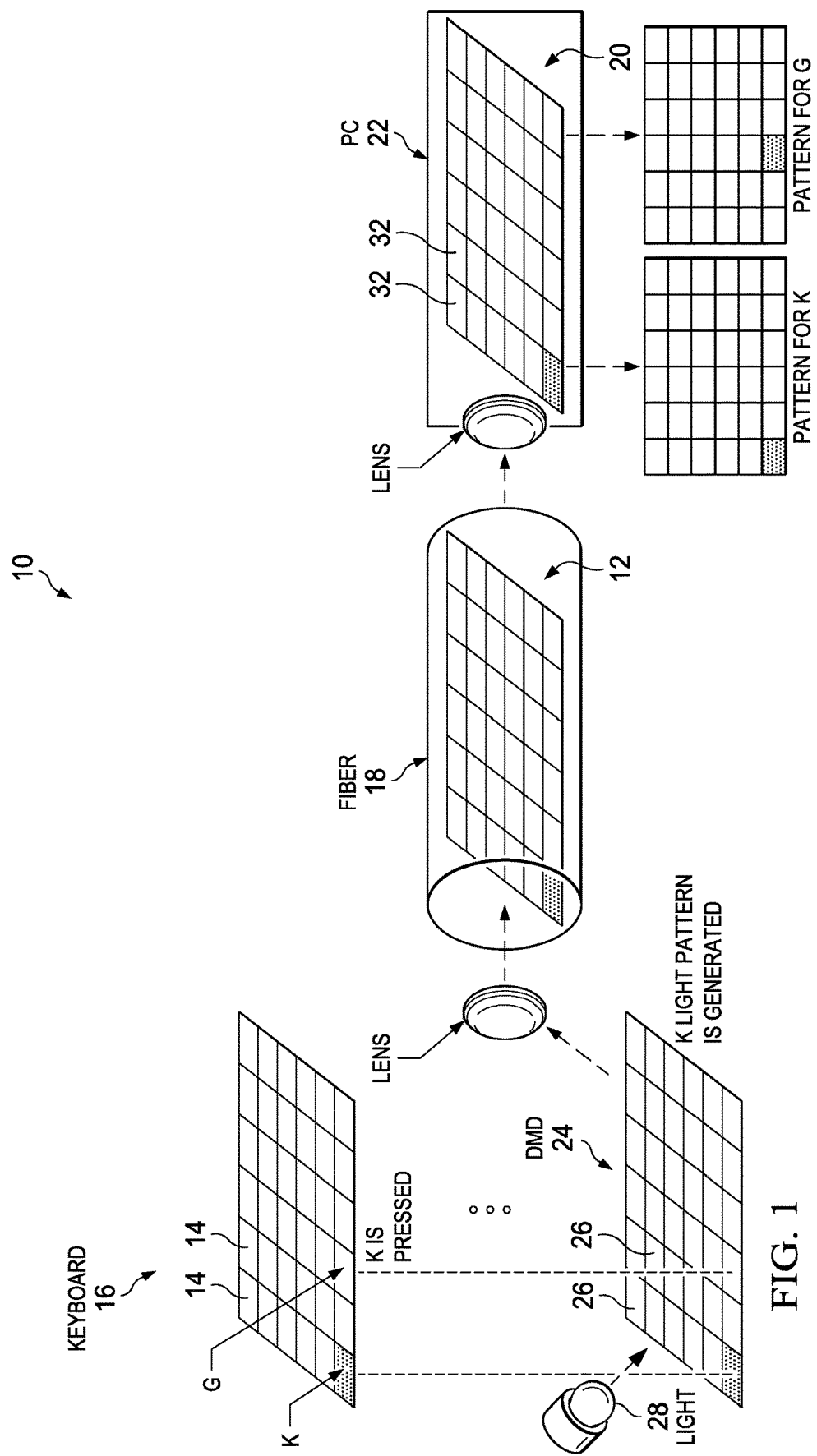
FIGS. 1-3 are schematic views illustrating an example optical interface for keystroke data transmission between a keyboard input device and a personal computer.
Figure 2:
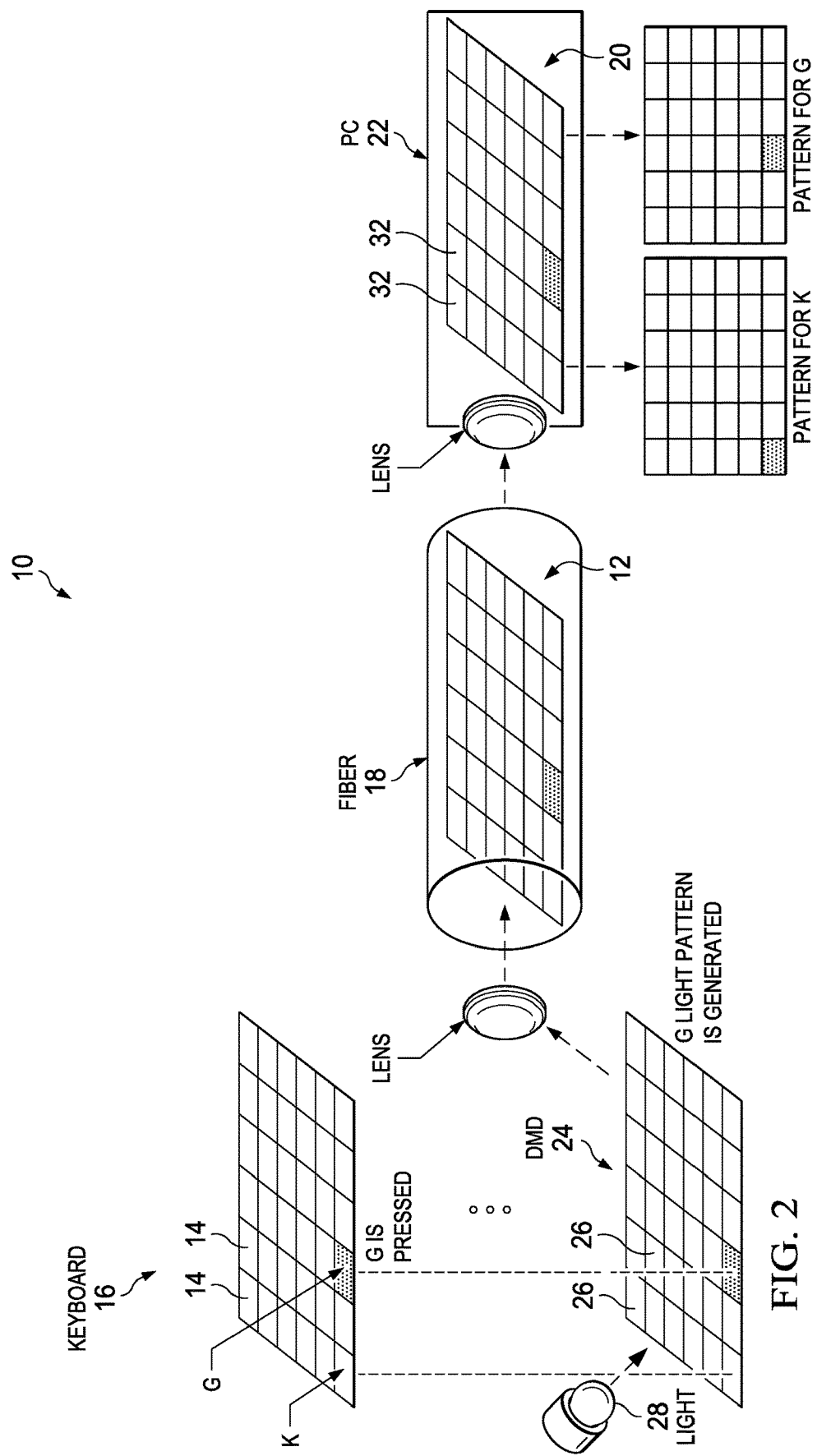
Figure 3:
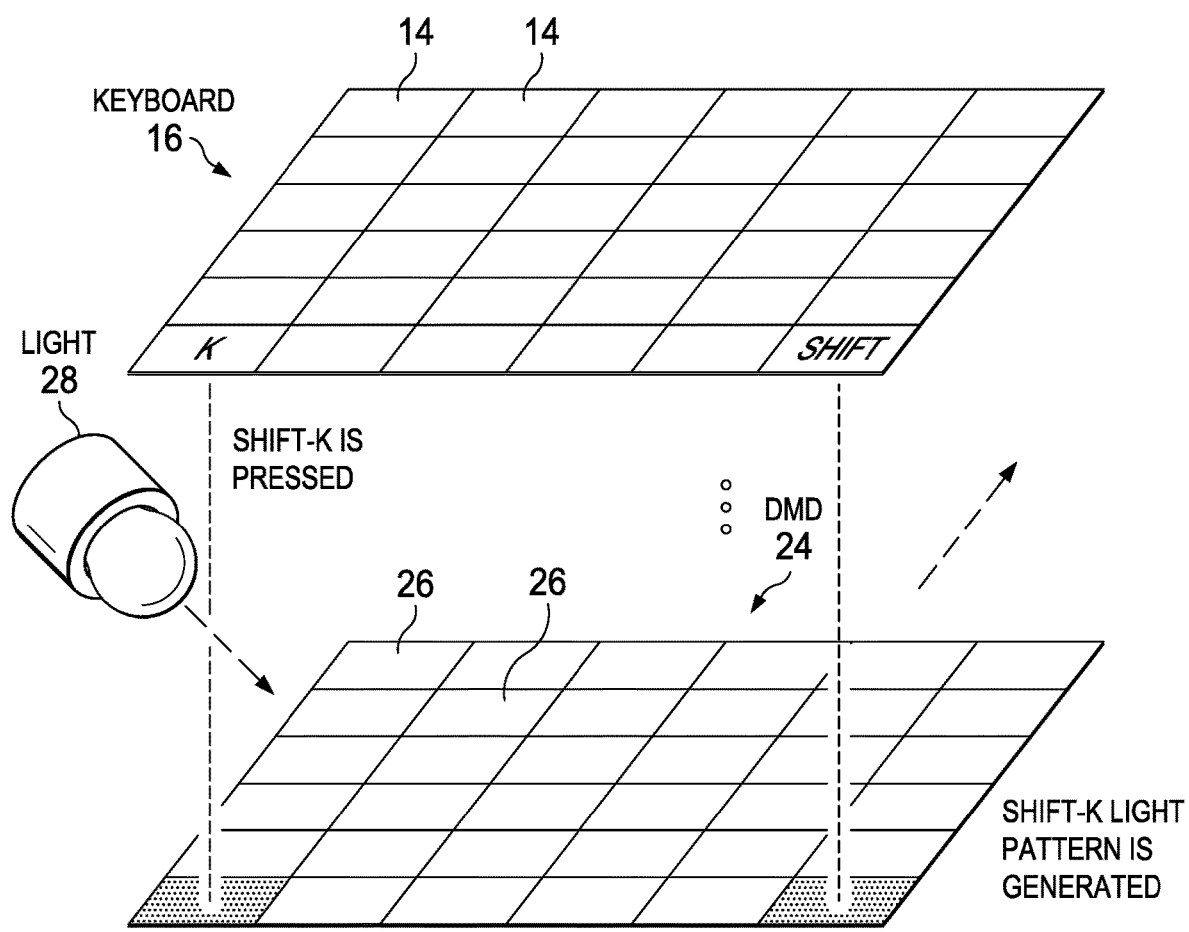

FIGS. 1-3 illustrate an example implementation of an optical interface 10 for transmitting data between a data transmitter and a data receiver, wherein light patterns 12 generated in response to key strokes entered on keys 14 of a keyboard 16 are transmitted via an optical transmission channel 18 to a light sensor 20 for detection of the entered key strokes by a personal computer (PC) 22.

The example implementation utilizes a MEMS (microelectromechanical system) device 24 having an array of mirrors 26 whose mirror positions are set in response to the entered keystrokes to generate the light patterns under illumination of light from a light source 28. An example MEMS device 24 usable for this purpose is a digital micromirror device (DMD), such as a Texas Instruments DLP® DMD device. Device 24 has an n row x m column array of individually addressable "ON"/"OFF" position settable micromirror pixel elements 26. An example DMD device is described in Texas Instruments DLP3000, DLPC300, DLP® 0.3 WVGA Chipset Data Manual, Literature Number: DLPZ005A, January 2012-Revised July 2013, the entirety of which is incorporated by reference herein.

The settings of mirrors 26 are controlled according to an encoding scheme whereby depression of keys 14 on keyboard 16 sets to the "ON" positions a designated corresponding one or more mirrors 26, so that illumination of the array 24 by light source 28 generates a unique light pattern 12 for each keystroke entry.

FIGS. 1-2 illustrate an example encoding scheme wherein depression of each single key 14 sets the "ON" position for a different individual single one or group of mirrors 26, in one-to-one correspondence. FIG. 1 shows that depressing the single "K" key 14 on keyboard 16 results in illumination of the corresponding single mirror or group of mirrors 26 located in the lower left corner of the illustrated array, with transmission of the generated corresponding lower left corner light pattern 12 over optical path 18 to detector 20. FIG. 2 shows that depressing the single "G" key 14 on keyboard 16 results in illumination of the corresponding single mirror or group of mirrors 26 located in the bottom middle of the array, with transmission of the generated corresponding lower middle light pattern 12 over optical path 18 to detector 12.

In this scheme, each single key depression results in illumination of a different mirror or group of mirrors, with no mirrors being set to the "ON" position for more than one single key depression. For keystrokes such as Shift-K, Ctrl-Alt-Del, etc. that involve the depression of more than one key, this scheme simply sets the "ON" positions for all component keys of the multiple key stroke, generating a composite light pattern made up of the combination of the separate patterns for each respective component key. FIG. 3 shows the multiple key depression scenario wherein simultaneously depressing the "K" and "Shift" keys 14 on keyboard 16 results in the simultaneous illumination both of the mirror or group of mirrors 26 located in the lower left corner that correspond to the single "K" key depression and of the mirror or group of mirrors 26 located in the lower right corner that correspond to the single "Shift" key depression, with transmission of the combination pattern 12 over optical path 18 to detector 12. To simplify the processing on the receiver side for patterning such as the grid structure patterning shown in FIGS. 1-3, borders of unassigned (unused) mirrors or groupings of mirrors may be left marginally surrounding the used mirrors or groupings to enable better discernment between patterns.

It will be appreciated that the particular coding scheme selected may be established according to individual needs and preferences, and that the relative physical locations of the mirrors or groups of mirrors turned "ON" (or "OFF") in response to key depression may or may not bear a similarity to the relative physical locations of those keys on the keyboard. It will also be appreciated that the unique one-to-one correspondence between the single keys and the respective single mirrors or groups of mirrors shown in FIGS. 1-3 is merely presented by way of simple example, and that actual coding may establish patterns involving mirror reuses, non-adjacent placements, and other complexities. The correspondence between keys 14 depressed and mirror 26 settings is preferably established by direct (viz., wire routing) connection between the keys and mirror setting components of the DMD or DMD controller.

The basic structure and operation (including mirror setting operation) of DMD devices is described in Texas Instruments Application Report DLPA0008A—July 2008 —Revised October 2013, entitled "DMD 101: Introduction to Digital Micromirror Device (DMD) Technology," the entirety of which is incorporated herein by reference.

As described there, the DMD has a memory cell formed below each micromirror (pixel) whose state (logical "0" to logical "1" and vice versa) may be loaded as a precursor to setting the mechanical position of the mirror. However, loading the memory state does not by itself alter the mirror state. In order to transfer the memory state to the mirror, the pixel must first receive a mirror clocking (or reset) pulse. Such pulse momentarily releases the mirror and re-lands it based on the state of the memory below. This allows the memory of groups of pixels to be pre-loaded and then their mechanical positions to be changed simultaneously with a mirror clocking pulse.

As further described there, for purposes of applying the clocking pulses to set the mirror states to the memory states, the DMD is divided into blocks (reset blocks). For example, 2xL VDS XGA Type A devices are divided into 16 blocks of 48 rows each. A mirror clocking pulse is issued to a block, so that all pixels in the same block are set to their new (or same) memory state positions at the same time. Pixels in that block whose memory state data has changed ("0" to "1", or vice versa) move to the opposite mechanical position ("OFF" to "ON", or vice versa) and pixels in that block whose memory state data has not changed remain in the same mechanical position.

The XGA DMD has 16 mirror clocking pulse lines (0-15) and there are four mirror clocking pulse modes that determine which blocks receive a mirror clocking pulse when issued: single block, dual block, quad block, and global (all blocks). Thus, different approaches are available for setting the DMD mirrors in correspondence with key strokes.

In one approach, the keys can be connected so that key depression changes the precursor data that is loaded into memory, using an encoding scheme that programs the data according to which key or keys are depressed. This approach might, for example, be implemented with all blocks grouped together using the global clocking mode. Then, when the single "K" key is depressed, connections between the keys and the DMD or DMD controller will make voltage changes on the data input lines, so that "ON" ("1") position memory states will be loaded into the memories associated with the lower left group of mirrors and so that "OFF" ("0") position memory states will be loaded into memories associated with all other mirrors. Then, upon receipt of the global mode clock signal at all blocks, the memory states will be simultaneously transferred to re-land the mirrors, and put the mirrors into positions that generate the light pattern previously described for the "K" key stroke.

In another approach, the keys can be connected so that key depression controls the order and/or mode of applying the mirror clocking pulses. So, for the XGA DMD with 16 mirror clocking pulse lines and four mirror clocking modes, each key stroke may be connected to apply mirror clocking signals to a different unique combination of the 16 memory blocks to generate a corresponding unique light pattern for each key stroke. Thus, for example, the memories of all mirrors of all blocks could be toggled between the "OFF" ("0") and "ON" ("1") position memory states. With the memories of all blocks first set to the "OFF" ("0") position memory state, applying a clocking pulse to all blocks (global reset) would place all mirrors of the entire array into their mechanical "OFF" ("0") positions, giving a no light pattern. Then, with the memories of all blocks reloaded to put them into their "ON" ("1") position memory states, applying a clocking pulse to only those clocking pulse lines that correspond to the coding for the particular key stroke entered would result in transfer of the "ON" position setting to only those memories located in the blocks receiving the clocking pulses, giving a different unique light pattern (a different combination of illuminated/non-illuminated blocks) for each respective key stroke. The latter approach has the advantage that toggling between all "0's" and all "1's" can be done internally within the DMD chipset with no need to apply external data to the data input lines.

Making direct connections between the keys and the DMD/DMD controller without providing key attributable electrical signatures provides additional electronic eavesdropping protection. Identifying that a key has been depressed is not the same as identifying which key has been depressed.

Such direct connection may be established by direct (wired) connection or by some intermediate mechanism. In one direct wiring approach, keys are wired to physically make or break connections between voltage sources and DMD/DMD controller terminals. Pressing a specific key causes application of a high or low voltage to a particular one or set of terminals (e.g., data input or reset lines). In another approach, keys are wired through an intermediary that translates standard key depression signals into inputs to the DMD/DMD controller terminals. Such an intermediary may, for example, include one or more pre-stored or locally generated look-up tables. The look-up table content and/or selection among multiple look-up tables can be modified to provide dynamic preset or random (pseudo-random) variation in the encoding scheme (with, for example, keys to code change variations transmitted optically to the receiver). Such look-up tables may also be programmed into the DMD chip set itself.

The generated light patterns 12 are communicated from keyboard 16 (or interface transmitter end add-on to keyboard 16) optically through optical transmission channel 18 to detector 20 at PC 22 (or interface receiver end add-onto PC 22). Channel 18 may comprise one or more optical fibers, having input and output end lenses, as shown in FIGS. 1-3. Channel 18 may also or alternatively comprise air or some other optical transmission medium.

The light sensor 20 may comprise a detector pixel array having detector elements arranged in one-to-one correspondence with mirrors or groups of mirrors 26 in the mirror pixel array of DMD 24. Such detector arrangement may be configured similarly to the detector arrangement described in Carver et al. U.S. Pat. No. 8,208,759, entitled "Light valve projection of visible image correlated with non-visible image," the entirety of which is incorporated herein by reference. The PC is connected to process samples of the detected patterns and compare them to stored patterns for decoding the keystrokes encoded in the detected patterns for identifying user input entered at the keyboard 16.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

The invention claimed is:

1. A system comprising:
   a data transmitter adapted to be coupled to a keyboard;
   a first mirror having a first mirror position;
   a second mirror having a second mirror position;
   a mirror setting component coupled to the data transmitter, the mirror setting component configured to set the first mirror position and the second mirror position according to an encoding scheme to generate light patterns in correspondence with the one or more inputs entered at the keyboard, wherein each combination of the one or more inputs entered results in a unique light pattern;
   a data receiver including a light sensor; and
   an optical channel between the array of mirrors and the light sensor.

2. The system of claim 1, wherein the data receiver is a computer.

3. The system of claim 1, wherein the first mirror is a first micromirror of a digital micromirror device (DMD) and the second mirror is a second micromirror of the DMD.

4. The system of claim 3, wherein the data transmitter further includes a light source directed towards the DMD.

5. The system of claim 3, wherein the light sensor comprises a detector pixel array having detector elements arranged in one-to-one correspondence with the first and second micromirrors of the DMD.

6. The system of claim 1, wherein the optical channel includes an optical fiber.

7. A keyboard comprising:
   inputs;
   a digital micromirror device (DMD) having an array of micromirrors, the array of micromirrors have mirror positions set by a DMD controller electrically coupled to receive signals from the keyboard, the mirror positions set according to an encoding scheme to generate light patterns in correspondence with one or more inputs entered at the keyboard, wherein each combination of the one or more inputs entered results in a unique light pattern;
   a light source directed towards the array of micromirrors; and
   an optical transmission channel.

8. The keyboard of claim 7, wherein the inputs are connected to the DMD.

9. The keyboard of claim 7, wherein there is a one-to-one correspondence between the inputs and a micromirror of the array of micromirrors.

10. The keyboard of claim 7, wherein the optical transmission channel is operable to receive a light pattern from the array of micromirrors.

11. The keyboard of claim 7, wherein the inputs are connected to the array of micromirrors so as to create a unique light pattern for each input.

12. The keyboard of claim 7, wherein the optical transmission channel is an optical fiber.

13. A method of transmitting data from a keyboard to a computer, comprising:
   depressing a first input of a keyboard having keys;
   receiving in a micromirror controller component electrically coupled to the keyboard a signal corresponding to the first input;
   setting by the micromirror controller component at least one micromirror of an array of micromirrors to a first position in response to the depressed first input;
   directing a light towards the array of micromirrors to create a light pattern corresponding to the first input, wherein a unique light pattern is associated with each combination of the one or more inputs of the keyboard; and
   directing the light pattern through an optical transmission channel.

14. The method of claim 13, further comprising receiving the light pattern at a light sensor of the computer.

15. The method of claim 13, wherein each key is associated with a different micromirror of the array of micromirrors.

16. A data transmitter comprising:
   a keyboard with inputs;
   a digital micromirror device (DMD) electrically coupled to the keyboard inputs and having an array of micromirrors, wherein the array of micromirrors have separate mirror positions set by a DMD controller for the DMD coupled to receive the inputs from the keyboard, the mirror positions set according to an encoding scheme to generate light patterns in correspondence with the one or more inputs entered at the keyboard, wherein each combination of the one or more inputs entered results in a unique light pattern;
   a light source directed towards the array of micromirrors; and
   an optical transmission channel configured to receive a unique light pattern for each entered key.

\* \* \* \* \*